United States Patent
Agarwal et al.

(10) Patent No.: US 10,317,925 B2
(45) Date of Patent: Jun. 11, 2019

(54) ATTENUATING COMMON MODE NOISE CURRENT IN CURRENT MIRROR CIRCUITS

(71) Applicant: TEXAS INSTRUMENTS INCORPORATED, Dallas, TX (US)

(72) Inventors: Nitin Agarwal, Bangalore (IN); Rajavelu Thinakaran, Bangalore (IN); Sumit Dubey, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/473,209

(22) Filed: Mar. 29, 2017

(65) Prior Publication Data
US 2018/0284832 A1 Oct. 4, 2018

(51) Int. Cl.
*G05F 3/26* (2006.01)
*H03F 3/45* (2006.01)

(52) U.S. Cl.
CPC ........... *G05F 3/26* (2013.01); *H03F 3/45479* (2013.01)

(58) Field of Classification Search
CPC ................................ G05F 3/26; H03F 3/45479
See application file for complete search history.

(56) References Cited

U.S. PATENT DOCUMENTS

| | | | | |
|---|---|---|---|---|
| 5,506,543 A * | 4/1996 | Yung | ....................... | G05F 3/262 323/316 |
| 6,084,477 A * | 7/2000 | Corsi | .................... | H03F 3/3008 330/264 |
| 8,395,441 B1 * | 3/2013 | Thinakaran | ............. | G05F 3/262 327/541 |
| 2004/0257140 A1 * | 12/2004 | Bergmann | .............. | G05F 3/265 327/304 |
| 2006/0197513 A1 * | 9/2006 | Tang | ....................... | G05F 1/575 323/273 |
| 2008/0157874 A1 * | 7/2008 | Lin | ......................... | H03F 1/083 330/282 |
| 2008/0238549 A1 * | 10/2008 | Freitas | .................. | H03F 3/4565 330/261 |

\* cited by examiner

*Primary Examiner* — Fred E Finch, III
*Assistant Examiner* — Rafael O. De León Domenech
(74) *Attorney, Agent, or Firm* — Kenneth Liu; Charles A. Brill; Frank D. Cimino

(57) ABSTRACT

At least some embodiments are directed to a system comprising a capacitor coupled to a voltage supply rail and configured to carry a capacitor current that comprises first and second parts. The capacitor current is an alternating current (AC). A first current mirror component may couple to the capacitor and to the voltage supply rail and is configured to carry the first part of the capacitor current. A second current mirror component couples to the voltage supply rail and is configured to carry the second part of the capacitor current. The second part of the capacitor current is proportionally related to the first part of the capacitor current. A circuit couples to the second current mirror component. The capacitor and the first and second current mirror components are configured to attenuate a common mode noise current flowing to the circuit.

20 Claims, 2 Drawing Sheets

ATTENUATING COMMON MODE NOISE CURRENT IN CURRENT MIRROR CIRCUITS

BACKGROUND

Current mirrors are commonly used to provide bias currents and active load currents to the circuits in which they are implemented. Often, the voltage supply provided to a current mirror carries disturbances (e.g., noise) and provides such disturbances to the current mirror. Such disturbances may produce unwanted common mode noise currents in the current mirror, and these common mode noise currents may negatively impact circuitry coupled to the current mirror.

SUMMARY

At least some embodiments are directed to a system comprising a capacitor coupled to a voltage supply rail and configured to carry a capacitor current that comprises first and second parts. The capacitor current is an alternating current (AC). A first current mirror component may couple to the capacitor and to the voltage supply rail and is configured to carry the first part of the capacitor current. A second current mirror component couples to the voltage supply rail and is configured to carry the second part of the capacitor current. The second part of the capacitor current is proportionally related to the first part of the capacitor current. A circuit couples to the second current mirror component. The capacitor and the first and second current mirror components are configured to attenuate a common mode noise current flowing to the circuit.

At least some embodiments are directed to a system comprising a first current mirror component including a first transistor. The system also includes a second current mirror component coupled to the first current mirror component and including a second transistor. The system further comprises a capacitor coupled in parallel with the first transistor, a transistor pair coupled to the first transistor, and a current source coupled to the transistor pair. The system also comprises a node between the transistor pair and the current source that couples to gates of the first and second transistors.

At least some embodiments are directed to a method comprising receiving a variation in a supply voltage and adjusting an alternating capacitor current flowing through a capacitor based on the variation. The capacitor current has first and second parts. The method also comprises causing the first part of the capacitor current to flow through a first transistor in a first current mirror component. The method further includes causing substantially all of the second part of the capacitor current to flow through a second transistor in the second current mirror component. The first and second parts of the capacitor current are proportional to each other according to a ratio between the first and second transistors. The method also includes, as a result of substantially all of the second part of the capacitor current flowing through the second transistor, attenuating a common mode noise current flowing to a circuit coupled to the second transistor.

BRIEF DESCRIPTION OF THE DRAWINGS

For a detailed description of various examples, reference will now be made to the accompanying drawings in which.

DETAILED DESCRIPTION

At least some embodiments in this disclosure are directed to a system that is configured to attenuate current mirror common mode noise currents that are generated as a result of voltage supply disturbances (e.g., noise). One technique applied in embodiments to attenuate common mode noise current is the inclusion of circuitry in or near an input of a current mirror to manipulate the current in the input of the current mirror, which, in turn, manipulates the current in the output of the current mirror in such a way that common mode noise current flowing into adjacent circuitry is attenuated. By attenuating common mode noise current, the power supply rejection ratio is improved. As a result, circuitry within which the current mirror is implemented—or to which the current mirror is coupled—is protected from the adverse effects of voltage supply disturbances.

At least some such embodiments may include a current mirror having first and second components (e.g., input and output components), each of which couple to a voltage supply rail (e.g., $V_{DD}$). Each of the components may include a transistor, and the transistors may be sized at a 1:N ratio (e.g., with the transistor size in the second component being N times the transistor size in the first component). In some embodiments, a capacitor couples in parallel with the transistor in the first component, and this capacitor may be configured to carry a capacitor current having first and second parts. The first part of the current may flow through the transistor in the first component, and the second part of the current may flow through a mirrored circuit that may be identical to a circuit that couples to the second component, as described in greater detail below. The mirrored circuit couples to a biasing direct current source, which causes the second part of the current to flow through the mirrored circuit and toward the transistor in the second component. The second part of the current flows through the transistor in the second component, leaving minimal or no common mode noise current flowing toward the aforementioned circuit coupled to the second component. Because the common mode noise current flowing to this circuit is attenuated, the power supply rejection ratio is improved. Thus, disturbances in the power supply rail do not adversely impact the circuit coupled to the second component. The circuit that is protected from such power supply disturbances may be any suitable circuit that makes use of the output of a current mirror. These and other embodiments are now described in greater detail with reference to FIGS. 1-3.

Figure 1:
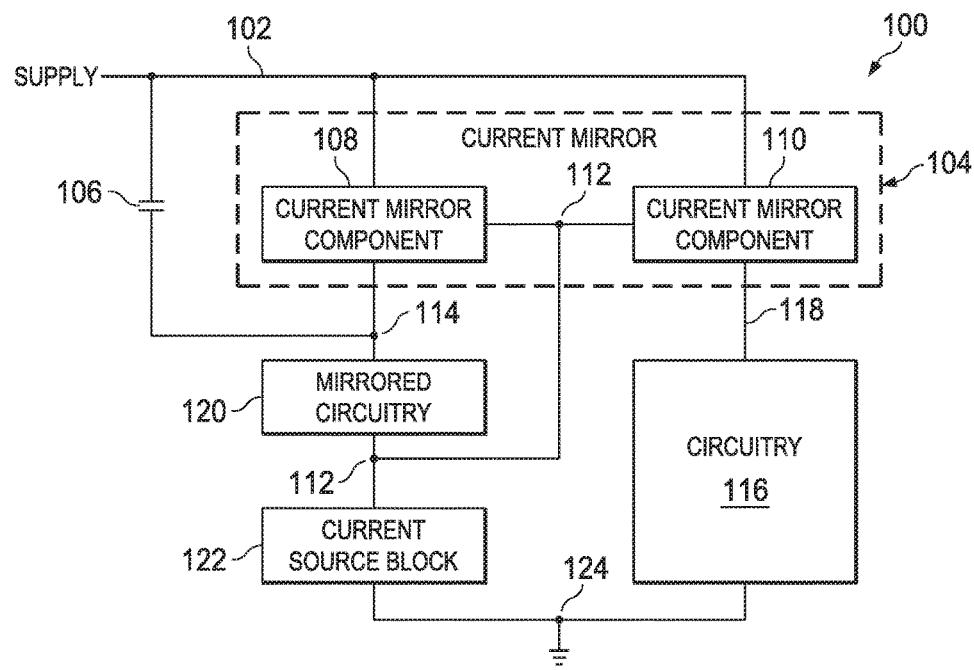
FIG. 1 is a block diagram of a system configured to attenuate common mode noise current.

FIG. 1 is a block diagram of a system 100 configured to improve a power supply rejection ratio by attenuating common mode noise current. The system 100 may comprise a voltage supply rail 102 and a current mirror 104 coupled to the voltage supply rail 102. The current mirror 104, in turn, may include multiple current mirror components 108 and 110. The current mirror component 108 may, for instance, be a current mirror input component configured to receive an input current, and the current mirror component 110 may, for example, be a current mirror output component configured to produce an output current that mirrors the input current. The precise circuitry within the current mirror components 108 and 110 may vary between various embodiments, and FIG. 2—described below—depicts at least one such embodiment. In some embodiments, each of the current mirror components 108 and 110 couples directly to the voltage supply rail 102. In some embodiments, the current mirror components 108 and 110 couple to each other via a node 112. For example, the current mirror components 108 and 110 may include transistors having gates that couple to each other via the node 112.

In some embodiments, the system 100 may additionally include a capacitor 106 coupled between the voltage supply rail 102 and a node 114. Accordingly, in some such embodiments, the capacitor 106 couples in parallel with the current mirror component 108. The capacitance of the capacitor 106 may be selected as desired; however, in at least some embodiments, the capacitance of the capacitor 106 is selected based at least in part on a sizing ratio between transistors in the current mirror components 108, 110 and a capacitance associated with a transistor (e.g., the gate-to-drain capacitance of a transistor) in the current mirror component 110, as described below.

The system 100 may further comprise circuitry 116 and mirrored circuitry 120. The circuitry 116 may be any type of circuit that performs any suitable function(s) and that is able to use a mirrored current produced by the current mirror 104 to perform its function(s). Regardless of the contents of the circuitry 116, a portion of the circuitry 116 may be replicated and included as, or at least as part of, the mirrored circuitry 120. In this manner, the mirrored circuitry 120 may cause the impedance conditions at node 114 to more closely mimic the impedance conditions at node 118. For example, the circuitry 116 may include a pair of parallel-coupled transistors, the drains and/or sources of which couple to the node 118. In such embodiments, the mirrored circuitry 120 may include another pair of parallel-coupled transistors, identical to the transistor pair in the circuitry 116, having drains and/or sources that couple to the node 114. Thus, the impedance conditions at the node 114 in the direction of the mirrored circuitry 120 (i.e., "looking toward" the mirrored circuitry 120) may more closely mimic the impedance conditions at the node 118 in the direction of the mirrored circuitry 116 (i.e., "looking toward" the mirrored circuitry 116). In some embodiments, one end of the mirrored circuitry 120 couples to the node 114, and another end of the mirrored circuitry 120 couples to the node 112.

In some embodiments, the system 100 further includes a current source block 122. The precise contents of the current source block 122 may vary, but, in some embodiments, the block 122 includes a direct current (DC) source to bias the system. The current sourced by the current source block 122 may be selected as desired to achieve any suitable biasing targets. The current source block 122 couples to a reference rail 124 (e.g., ground), as does the circuitry 116.

In operation, the voltage supply rail 102 provides voltage to the current mirror 104 and to the capacitor 106. As explained above, the voltage carried on the voltage supply rail 102 may experience disturbances (e.g., noise), and this noise may undesirably increase the common mode noise current in the current mirror 104, and, more particularly, in the common mode noise current that flows into the circuitry 116. This may cause undesirable effects within the circuitry 116. Accordingly, the system 100 attenuates (e.g., eliminates) the common mode noise current flowing into the circuitry 116. To attenuate the common mode noise current flowing into the circuitry 116, the capacitor 106—selected to have a capacitance as described in greater detail below—may cause a capacitor current to flow between the voltage supply rail 102 and the node 114. This current may be expressed as:

$$I1 + I1/N \quad (1)$$

where current I1 is the current that flows through a transistor in the current mirror component 110, and 1:N is the sizing ratio of a transistor in the current mirror component 108 to the transistor in the current mirror component 110. The current expressed in (1) may flow to the node 114, at which point a portion of the current in (1) may flow through the transistor in the current mirror component 108 and the remainder of the current in (1) may flow through the mirrored circuitry 120. The current flowing through the transistor in the current mirror component 108 may be expressed as:

$$I1/N \quad (2)$$

and the current flowing through the mirrored circuitry 120 may be expressed as:

$$I1 \quad (3)$$

Figure 2:
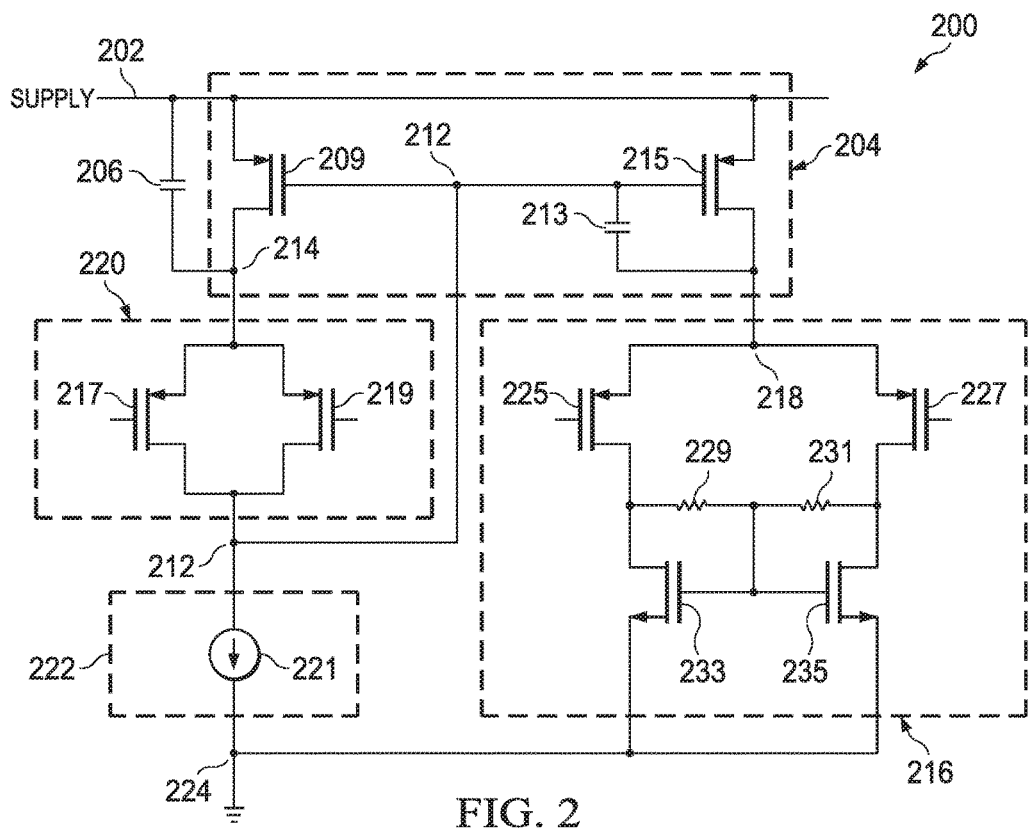
FIG. 2 is a circuit schematic diagram of a system configured to attenuate common mode noise current.

The current in (3) flows to the node 112. Because the current source block 122 contains a direct current source, it prevents or at least mitigates the sinking of common mode, high-frequency (e.g., 100 kHz or more), alternating current (AC). Accordingly, the current in (3) flows from the node 112 toward the current mirror component 110. The current in (3) may, in some embodiments, flow to the gate of the transistor in the current mirror component 110. In some embodiments, different circuitry may accept the current in (3) from the node 112. In either case, the current mirror component 110, upon receipt of the current in (3), may cause the current in (3) to flow toward the voltage supply rail 102 and may result in minimal or no current flowing toward the circuitry 116 via the node 118. Stated another way, in other systems, a common mode noise current introduced by fluctuations in the voltage supply rail 102 may flow into the circuitry 116 via the node 118. In embodiments of the system 100, however, the capacitor 106, the mirrored circuitry 120, the current source block 122, and the transistors in the current mirror components 108, 110 are configured so as to route the common mode noise current that would otherwise flow to the circuitry 116 away from the circuitry 116. In this way, the power supply rejection ratio is improved. Illustrative configurations of the various components of the system 100 are now described with reference to FIG. 2. FIG. 2 does not limit the scope of this disclosure, and all variations and equivalents of the embodiment depicted in FIG. 2 fall within the scope of this disclosure.

FIG. 2 is a circuit schematic diagram of a system 200 configured to improve a power supply rejection ratio by attenuating common mode noise current. The system 200 is a more specific embodiment of the system 100 shown in FIG. 1. As shown in FIG. 2, the system 200 may include a voltage supply rail 202 coupled to a current mirror 204. The current mirror 204, in turn, may include a transistor 209 and a transistor 215. In some embodiments, the transistor 209 is a metal oxide semiconductor field effect transistor (MOSFET) such as a p-type MOSFET, although other types of transistors and circuit components that are able to achieve the functionality described herein may be used instead. Similarly, in some embodiments, the transistor 215 is a MOSFET such as a p-type MOSFET, although other types of transistors and circuit components that are able to achieve the functionality described herein may be used instead. The transistors 209 and 215 may be included as parts of the current mirror components 108 and 110 (FIG. 1), respectively. The current mirror components are not specifically delineated in FIG. 2 for the sake of clarity and simplicity. The source of the transistor 209 and the source of the transistor 215 couple to the voltage supply rail 202. The gates of the transistors 209 and 215 couple to each other via node 212. The drain of the transistor 209 couples to a node 214, and the drain of the transistor 215 couples to a node 218. In some embodiments, a capacitor 206 couples to the voltage supply rail 202 and to the node 214. In some embodiments, the capacitor 206 and the transistor 209 are coupled in parallel with each other.

The current mirror 204 may include a capacitor 213. In at least some embodiments, the capacitor 213—although represented in FIG. 2 as an individual circuit component—is actually a part of the transistor 215 (e.g., the inherent gate-to-drain capacitance of the transistor 215) and is not a standalone circuit component. However, for ease of understanding, this disclosure describes the inherent gate-to-drain capacitance of the transistor 215 as a standalone capacitor 213, as depicted in FIG. 2. In some embodiments, the capacitance of the capacitor 206 is selected based at least in part on the capacitance of the capacitor 213. For example, the capacitance of the capacitor 206 may be expressed as:

$$C1+C1/N \qquad (4)$$

where C1 is the capacitance of the capacitor 213 and 1/N is the sizing ratio of the transistor 209 to the transistor 215.

The system 200 includes circuitry 216. The circuitry 216 may illustratively include, for instance, a pair of transistors (e.g., p-type MOSFETs) 225 and 227 having sources that couple to each other and to node 218. The gates of the transistors 225 and 227 may be controlled by any suitable circuitry within or external to the system 200. The circuitry 216 may further include a pair of transistors 233 and 235 (e.g., n-type MOSFETs) having sources that couple to each other and to the reference rail 224 (e.g., ground). The gates of the transistors 233 and 235 couple to each other. The drain of the transistor 233 couples to the drain of the transistor 225, and the drain of the transistor 235 couples to the drain of the transistor 227. A resistor 229 couples to the drains of the transistors 225 and 233 and to another resistor 231, which, in turn, couples to the drains of the transistors 227 and 235. The resistors 229 and 231 couple to each other and to the gates of the transistors 233 and 235. As mentioned previously with reference to circuitry 116 in FIG. 1, the circuitry 216 in FIG. 2 may comprise any suitable circuitry capable of using the output of a current mirror and that would benefit from attenuated common mode noise current received from the current mirror. The precise design specifications of the components within the circuitry 216 are not directly relevant and thus are not described.

The system 200 may further comprise a pair of transistors 217 and 219 (e.g., p-type MOSFETs), which together form mirrored circuitry 220. In at least some embodiments, these transistors 217 and 219 form part or all of the mirrored circuitry 120 described with respect to FIG. 1. The sources of the transistors 217 and 219 couple to each other and to the node 214. The drains of the transistors 217 and 219 couple to each other and to node 212, which, as described, couples to the gates of the transistors 209 and 215. The mirrored circuitry 220 is identical to at least part of the circuitry 216, with the goal of having identical impedance conditions from node 214 "looking toward" the mirrored circuitry 220 as exist at the node 218 "looking toward" the circuitry 216. Accordingly, the transistors 217 and 219 are selected and configured using the transistors 225 and 227 so as to create the same impedance conditions at the node 214 as those that exist at the node 218. Thus, for instance, the transistors 217 and 225 may have identical design specifications, and the transistors 219 and 227 may have identical design specifications. Similarly, the gates of the transistors 217 and 225 may receive identical control signals, and the gates of the transistors 219 and 227 may receive identical control signals. In some embodiments, the transistors 217 and 219 may be replaced by a single transistor with an equivalent current density and with a gate that may be controlled by a separate bias voltage provided by additional biasing components in the system 200. Such a transistor may ensure that the voltages at nodes 214 and 218 are identical or at least within a predetermined range of each other.

The system 200 may still further comprise a direct current source 221. The direct current source 221 may form part or all of a current source block 222 that may bias the system as desired. The current provided by the current source block 222 (and, more particularly, by the direct current source 221) is a bias current that is mirrored by the transistor 215 in the second current mirror component. For example, if the sizing ratio between transistors 215 and 209 is N:1, the bias current provided by the current source block 222 is multiplied by N and this increased direct current flows through the transistor 215.

The transistors 209 and 215 may have a sizing ratio of 1:N. Furthermore, in at least some embodiments, the gates of the transistors 209 and 215 are coupled together, and the sources of the transistors 209 and 215 are coupled together. Because the gates and the sources of the transistors are coupled in this manner, the Vgs voltages for the transistors are the same, and the transistors are thus activated and deactivated at the same or similar times. In light of the foregoing aspects of the transistors 209 and 215, the current flowing through the transistor 215 (e.g., when in the active or saturation regions) may be N times the current flowing through the transistor 209 at the same time (e.g., when in the active or saturation regions).

In operation, the capacitor 206 causes an alternating current (e.g., a high-frequency AC) to flow between the voltage supply rail 202 and the node 214. This current may be expressed as shown in (1). At node 214, the current in (1) may be divided such that the current expressed in (2) flows through the transistor 209 and the current expressed in (3) flows through the pair of transistors 217 and 219 toward the node 212, with the gates of the transistors 217 and 219 being supplied with the appropriate signals to facilitate the flow of the current in (3). The presence of the capacitor 206 may thus reduce the current that would otherwise flow through the transistor 209 if the capacitor 206 were absent. As a result of this reduced current flow through the transistor 209, the current flow through the transistor 215, which is a function of the current flow through the transistor 209 (i.e., due to the transistor gates being tied together and the sources being tied together), may also be reduced relative to the current that would otherwise flow through the transistor 215. More specifically, the current expressed in (3) flows through the pair of transistors 217 and 219 and to the node 212. Because the DC source 221 mitigates the sinking of high-frequency, common mode, alternating current, the current expressed in (3) that flows through the pair of transistors 217 and 219 to the node 212 subsequently flows toward the gates of the transistors 209 and 215. The current expressed in (3) flows through the capacitor 213 toward the node 218 (i.e., the current in (3) controls the gate of the transistor 215 such that the current flowing between the transistor 215 and the node 218 is the same as in (3)). The current flowing through the transistor 215 must be N times the current flowing through the transistor 209. Because the current flowing through the transistor 209 is expressed in (2), the current flowing through the transistor 215 is the current expressed in (3). Because the current flowing from node 212 to node 218 is expressed in (3) and the identical current expressed in (3) flows through the transistor 215, the common mode noise current that would otherwise flow through the node 218 into the transistors 225 and 227 may be significantly attenuated (e.g., is zero or is within a predetermined range of zero). The details of the operation of the circuitry beyond node 218 (e.g., transistors 225, 227, etc.) are not relevant and thus are not described here. In general, however, the circuitry 216 exemplifies the negative consequences that may occur in any circuitry that receives a mirrored current from the current mirror 204. For example, any common mode, high-frequency, alternating current that is not cancelled and that flows into the circuitry 216 may result in a disturbance in the output voltage across the drains of the transistors 225 and 227 if there is any sizing mismatch between the transistors 225 and 227 (i.e., due to the mismatched common mode AC flow through the mismatched transistors 225 and 227). Thus, attenuating the common mode AC flow into the circuitry attenuates disturbances in the output of the circuitry 216. In some embodiments, circuitry 216 may comprise an amplifier that may be used as an integrator in a sigma-delta analog-to-digital converter (ADC) for which an alternating common mode noise current causes undesirable outcomes (e.g., degradation of the signal-to-noise-and-distortion ratio (SNDR)). Using the techniques described herein may mitigate the adverse impact of such alternating common mode noise currents.

Figure 3:
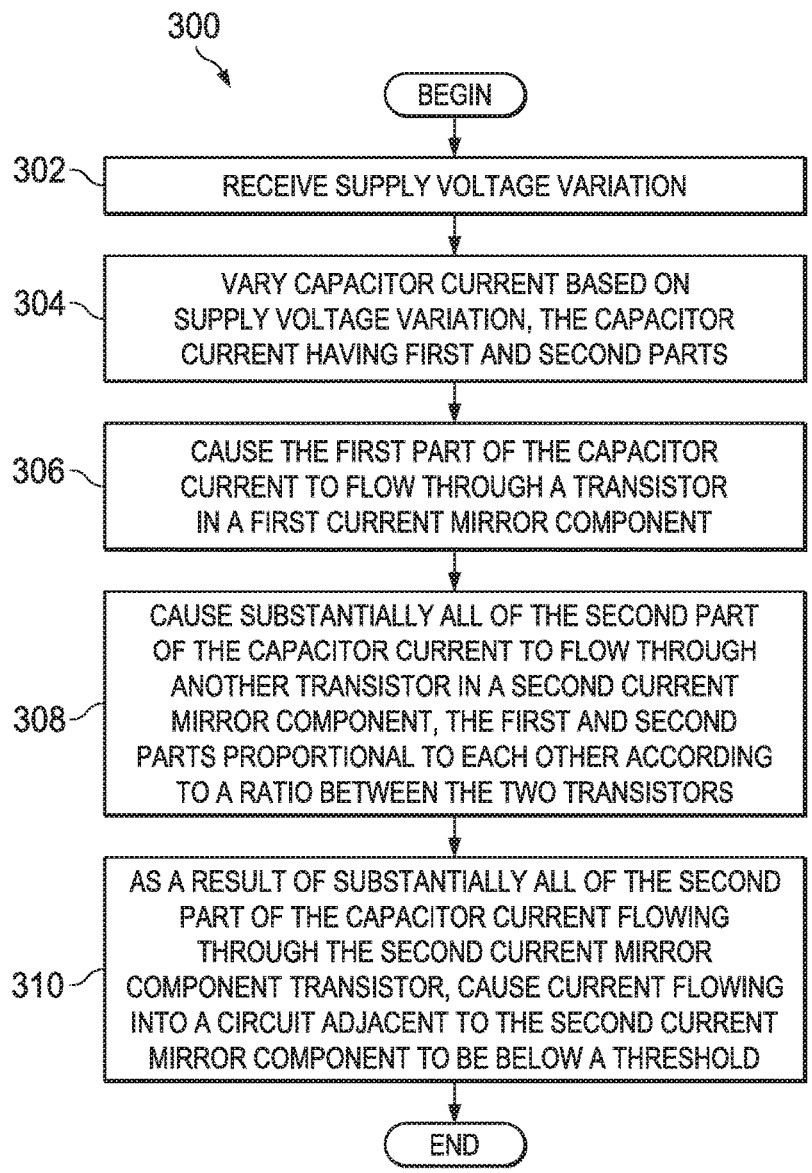
FIG. 3 is a flow diagram of a method to attenuate common mode noise current.

FIG. 3 is a flow diagram of a method 300 to improve a power supply rejection ratio by attenuating common mode noise current. The method 300 may include receiving a supply voltage variation (step 302). For example, referring to FIG. 2, the voltage supply rail 202 may experience fluctuations (e.g., noise). In at least some instances, the fluctuations may be high frequency (e.g., 100 kHz or greater). The method further comprises varying the current passing through the capacitor 206 according to the supply voltage variation on the rail 202 (step 304). As explained above, the current flowing from node 202 to the node 214 may be characterized as in (1), which has first and second parts. The method 300 next includes causing the first part of the capacitor current (e.g., the current flowing "through" the capacitor 206) to flow through a transistor (e.g., transistor 209) in a first current mirror component (step 306). The method 300 subsequently includes causing substantially all (i.e., 90% or more) of the second part of the capacitor current to flow through another transistor (e.g., transistor 215) in a second current mirror component, with the first and second parts of the capacitor current being proportional to each other according to a sizing ratio between the two transistors (step 308). Finally, the method 300 may comprise—as a result of substantially all of the second part of the capacitor current flowing through the second current mirror component transistor—causing alternating current flowing into circuitry (e.g., circuitry 116 in FIG. 1; circuitry 216 in FIG. 2) adjacent to the second current mirror component to be below a threshold. For example, the alternating current flowing into the circuitry 216 may be zero or less than 10 milliAmps (step 310). Ideally, the alternating current flowing into the circuitry 216 is zero, but, in practice, a small amount of current may flow into the circuitry 216. The degree to which this current is controlled (i.e., attenuated) will determine the degree of disturbance in the output of the circuitry 216.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a capacitor coupled to a voltage supply rail and configured to carry a capacitor current that is an alternating current (AC), wherein the capacitor current has first and second portions;
a first current mirror component coupled to the capacitor and to the voltage supply rail and configured to carry a first current equal to the first portion of the capacitor current, wherein the first current mirror component includes a first transistor having a source terminal coupled to the voltage supply rail;
a second current mirror component coupled to the voltage supply rail and configured to carry a second current equal to a second portion of the capacitor current, wherein the second current mirror component includes a second transistor having a source terminal coupled to the voltage supply rail, and wherein the second portion of the capacitor current is proportionally related to the first portion of the capacitor current; and
mirrored circuitry including third and fourth transistors arranged in parallel so that a source terminal of the third transistor and a source terminal of the fourth transistor are coupled to each other and a drain terminal of the third transistor and a drain terminal of the fourth transistor are coupled to each other;
wherein the source terminals of the third and fourth transistors are coupled in common to the drain terminal of the first transistor; and
wherein the drain terminals of the third and fourth transistors are coupled in common to a gate terminal of the first transistor and to a gate terminal of the second transistor by a signal path that extends from a first node coupled to the drain terminals of the third and fourth transistors to a second node coupled to the gate terminals of the first and second transistors, wherein the signal path does not include the voltage supply rail.

2. The system of claim 1, wherein the first and second transistors have a sizing ratio 1:N, and wherein the first and second portions of the capacitor current are related by N.

3. The system of claim 2, wherein the capacitor has a capacitance C1(1+1/N), wherein C1 is a capacitance associated with the second transistor in the second current mirror component.

4. The system of claim 1, wherein the alternating current has a frequency of at least 100 kHz.

5. The system of claim 1, further comprising a direct current source coupled in common to the drain terminals of the third and fourth transistors.

6. The system of claim 5, wherein third and fourth transistors and the direct current source are configured such that the second portion of the capacitor current flows to the second current mirror component using the signal path extending from the first node to the second node.

7. The system of claim 1, further comprising a circuit coupled to a drain terminal of the second transistor of the second mirror component, wherein the capacitor and the first and second current mirror components are configured to attenuate a common mode noise current flowing to the circuit.

8. The system of claim 1, wherein the capacitor is coupled to the voltage supply rail at a first terminal of the capacitor, and wherein a second terminal of the capacitor is coupled to the drain terminal of the first transistor.

9. The system of claim 1, wherein the signal path does not include the source terminals of the first and second transistors.

10. The system of claim 1, wherein the second portion of the capacitor current is provided to the gate terminals of the first and second transistors via the signal path.

11. A system, comprising:
a first current mirror component including a first transistor;
a second current mirror component coupled to the first current mirror component and including a second transistor;
a capacitor coupled in parallel with the first transistor;
a transistor pair coupled to the first transistor;
a current source coupled to the transistor pair, wherein the first current mirror component, the transistor pair, and the current source are arranged in a series connection such that transistor pair is arranged between the first current mirror component and the current source; and
a node between the transistor pair and the current source that couples to gates of the first and second transistors.

12. The system of claim 11, further comprising a circuit coupled to the second current mirror component, the circuit comprising a second transistor pair identical to the transistor pair.

13. The system of claim 11, further comprising a circuit coupled to the second current mirror component, wherein the second transistor is configured to attenuate current flowing to the circuit.

14. The system of claim 13, wherein the current is a common mode noise current.

15. The system of claim 11, wherein the current source is a direct current source.

16. The system of claim 11, wherein the capacitor has a capacitance $C1(1+1/N)$, wherein C1 is a capacitance associated with the second transistor in the second current mirror component.

17. The system of claim 11, wherein the capacitor is configured to carry a capacitor current having first and second portions, the first and second portions related by a factor N, the factor N based on a sizing relationship between the first and second transistors.

18. The system of claim 11, wherein the node is part of a signal path that extends from the node to the gates of the first and second transistors, wherein the signal path does not include sources and drains of the first and second transistors.

19. The system of claim 18, wherein a current flowing between the transistor pair and the current source is supplied to the gates of the first and second transistors via the signal path.

20. The system of claim 11, wherein the node is part of a signal path that extends from the node to the gates of the first and second transistors, wherein the signal path does not include a voltage supply rail.

* * * * *